United States Patent
Mimis

(10) Patent No.: US 12,424,993 B2
(45) Date of Patent: Sep. 23, 2025

(54) AMPLIFIER AND AMPLIFICATION METHOD

(71) Applicant: Sony Semiconductor Solutions Corporation, Kanagawa (JP)

(72) Inventor: Konstantinos Mimis, Basingstoke (GB)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 553 days.

(21) Appl. No.: 17/799,792

(22) PCT Filed: Jan. 21, 2021

(86) PCT No.: PCT/GB2021/050127
§ 371 (c)(1),
(2) Date: Aug. 15, 2022

(87) PCT Pub. No.: WO2021/176194
PCT Pub. Date: Sep. 10, 2021

(65) Prior Publication Data
US 2023/0085041 A1 Mar. 16, 2023

(30) Foreign Application Priority Data
Mar. 6, 2020 (GB) .................................. 2003306

(51) Int. Cl.
*H03F 3/68* (2006.01)
*H03F 1/02* (2006.01)
(Continued)

(52) U.S. Cl.
CPC ........... *H03F 3/602* (2013.01); *H03F 1/0288* (2013.01); *H03F 1/3288* (2013.01); *H03F 3/24* (2013.01);
(Continued)

(58) Field of Classification Search
CPC ...... H03F 3/602; H03F 1/0288; H03F 1/3288; H03F 3/24; H03F 2200/451;
(Continued)

(56) References Cited

U.S. PATENT DOCUMENTS 6,211,734 B1 * 4/2001 Ahn ...................... H03F 1/3282
330/149
7,183,843 B1 * 2/2007 Jones ...................... H03F 3/602
330/53
(Continued)

FOREIGN PATENT DOCUMENTS

| EP | 2216901 A | 8/2010 |
| EP | 2442441 A2 | 4/2012 |

(Continued)

OTHER PUBLICATIONS

Hone, Thomas M et al, "Controlling Active Load-Pull in a Dual-Input Inverse Load Modulated Doherty Architecture", IEEE Transactions on Microwabe Theory and Techniques, Jun. 2012, p. 1797-1804, vol. 60, No. 6.

(Continued)

*Primary Examiner* — Khanh V Nguyen
(74) *Attorney, Agent, or Firm* — Tucker Ellis LLP

(57) ABSTRACT

An amplifier (300) comprising: a first signal path comprising first amplifier circuitry (105A) configured to receive a first signal (RF1) with a frequency and a variable phase and amplitude at the frequency; a second signal path comprising second amplifier circuitry (105B) configured to receive a second signal (RF2) with the frequency, wherein at least one of the relative phase and amplitude of the second signal is fixed at the frequency; combiner circuitry (106) configured to combine an output of the first amplifier circuitry and the second amplifier circuitry.

15 Claims, 9 Drawing Sheets

(51) Int. Cl.
*H03F 1/32* (2006.01)
*H03F 3/24* (2006.01)
*H03F 3/60* (2006.01)

(52) U.S. Cl.
CPC .................. *H03F 2200/451* (2013.01); *H03F 2201/3212* (2013.01)

(58) Field of Classification Search
CPC ... H03F 2201/3212; H03F 2203/21142; H03F 1/3258; H03F 1/3282; H03F 3/211; H03F 3/195; H03F 3/68; H03F 3/607; H03F 3/60
USPC ...................................... 330/124 R, 286, 295
See application file for complete search history.

(56) References Cited

U.S. PATENT DOCUMENTS

| | | | | |
|---|---|---|---|---|
| 7,427,895 | B1* | 9/2008 | Okubo | H03F 1/0288 330/136 |
| 8,638,168 | B1* | 1/2014 | Signoff | H03F 3/2175 330/124 R |
| 10,224,882 | B2 | 3/2019 | De Falco et al. | |
| 10,411,654 | B2 | 9/2019 | Hone et al. | |
| 2002/0125947 | A1 | 9/2002 | Ren | |
| 2007/0024356 | A1 | 2/2007 | Plymale, Jr. et al. | |
| 2008/0238544 | A1 | 10/2008 | Morris et al. | |
| 2009/0021301 | A1* | 1/2009 | Hellberg | H03F 1/0294 330/149 |

FOREIGN PATENT DOCUMENTS

| | | |
|---|---|---|
| EP | 2642660 A2 | 9/2013 |
| EP | 2882097 A1 | 6/2015 |

OTHER PUBLICATIONS

Hone, T el al, "Inverse Active Load-Pull in an Inverse Doherty Amplifier", 2013 IEEE Topical Conference on Power Amplifiers for Wireless and Radio Applications Jan. 20-20, 2013.

Hone, T et al, "Optimized Load Modulation in a Dohery Amplifier Using a Current Injection Techique", Proceedings of the 6th European Microwave Integrated Circuits Conference, Oct. 2011, p. 29610-11, Manchester, UK.

International Search Report from corresponding International Application No. PCT/GB2021/050127, mailed Apr. 30, 2021, 3 pages.

* cited by examiner

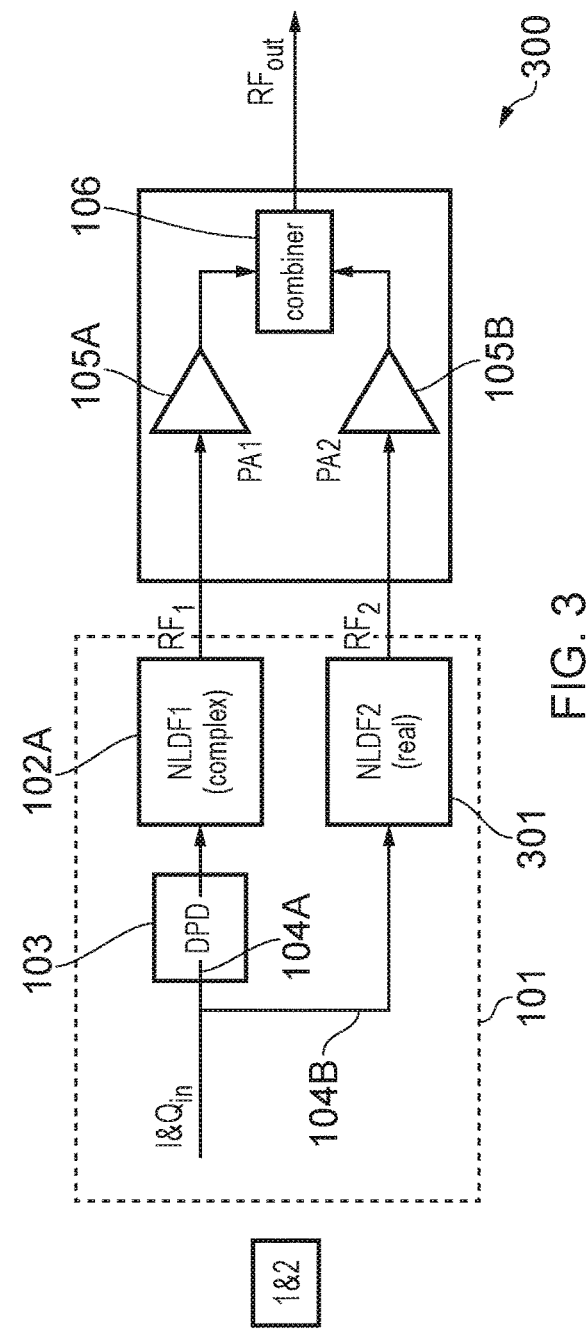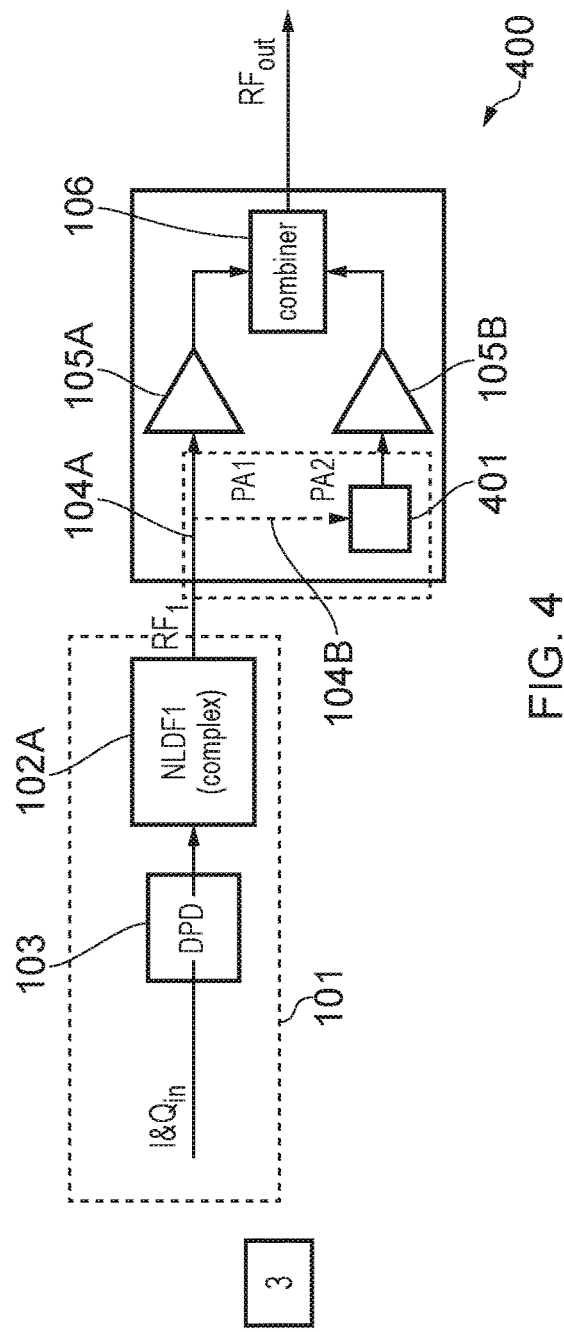

AMPLIFIER AND AMPLIFICATION METHOD

BACKGROUND

Field of the Disclosure

The present disclosure relates to an amplifier.

Description of the Related Art

The "background" description provided is for the purpose of generally presenting the context of the disclosure. Work of the presently named inventors, to the extent it is described in the background section, as well as aspects of the description which may not otherwise qualify as prior art at the time of filing, are neither expressly or impliedly admitted as prior art against the present disclosure.

Power amplifiers (which may be referred to simply as amplifiers) are used in many applications to increase the power of a signal. An example application is amplification of radio signals transmitted by base stations or terminal devices in wireless telecommunications networks. There is a desire to improve the power efficiency of such amplifiers to reduce power consumption. There is also a desire to reduce the complexity of such amplifiers to lower their cost and to make their installation easier.

SUMMARY

The present disclosure is defined by the claims.

BRIEF DESCRIPTION OF THE DRAWINGS

Non-limiting embodiments and advantages of the present disclosure will be best understood by reference to the following detailed description taken in conjunction with the accompanying drawings, wherein:

FIG. 3 schematically shows an amplifier according to a first embodiment;

FIG. 4 schematically shows an amplifier according to a second embodiment;

Like reference numerals designate identical or corresponding parts throughout the drawings.

DETAILED DESCRIPTION OF THE EMBODIMENTS

Figure 1:
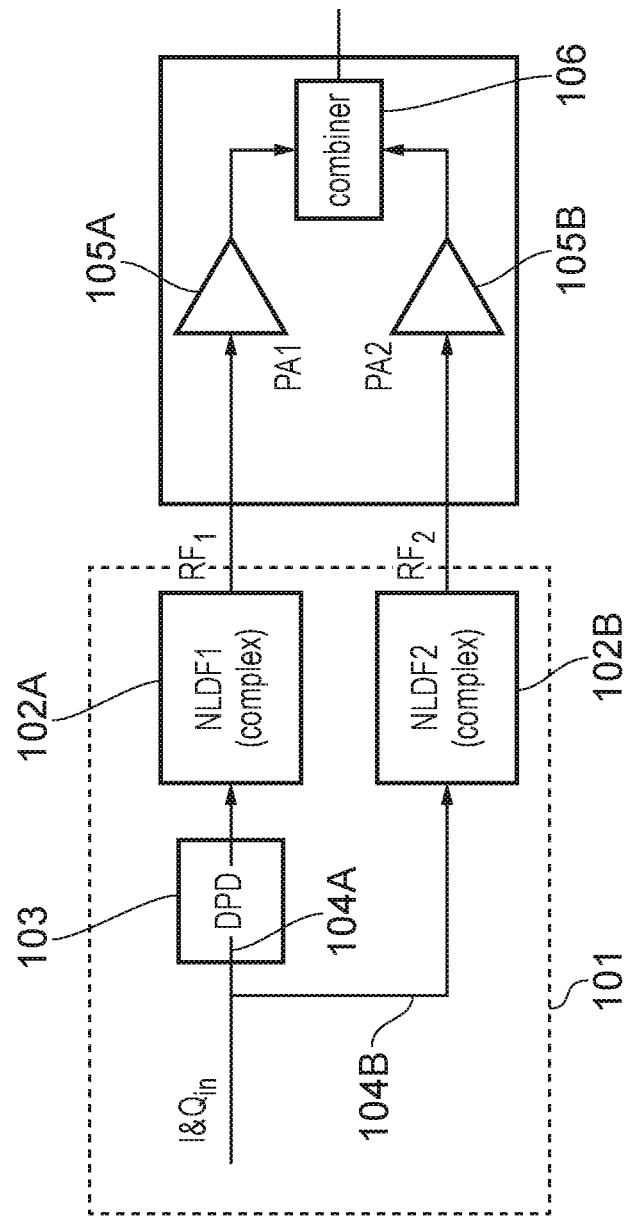
FIG. 1 schematically shows a known amplifier 100.

FIG. 1 shows a known amplifier 100. An input baseband signal I&$Q_{in}$ (in-phase and quadrature) is received and split into first and second signals by signal splitter circuitry (not shown). The first and second signals pass along separate first and second signal paths 104A and 104B, respectively.

On the first signal path 104A, digital pre-distortion (DPD) is performed on the first signal by DPD circuitry 103 (this is optional). A first complex non-linear drive function NLDF1 is then performed on the first signal by first complex non-linear drive function (NLDF) circuitry 102A. NLDF1 is performed on the first signal when the first signal is still in baseband I&Q form. The first signal is then converted to a first radio frequency (RF) signal $RF_1$ (using any suitable circuitry (not shown) to convert the first signal from digital to analogue, modulate a carrier and up-convert to generate $RF_1$). NLDF1 defines the phase and amplitude of $RF_1$ for a given amplifier output power and frequency. The phase and amplitude of $RF_1$ for a given amplifier output power and frequency are adjustable by adjusting one or more parameters of NLDF1. NLDF1 is implemented using look up tables, piecewise functions or polynomial functions, for example. $RF_1$ is then amplified by first power amplifier circuitry (first power amplifier) 105A and passed to combiner circuitry 106.

On the second signal path 104B, a second complex non-linear drive function NLDF2 is performed on the second signal by second complex NLDF circuitry 102B. NLDF2 is performed on the second signal when the first signal is still in baseband I&Q form. The second signal is then converted to a second radio frequency (RF) signal $RF_2$ (using any suitable circuitry (not shown) to convert the first signal from digital to analogue, modulate a carrier and up-convert to generate $RF_2$). NLDF2 defines the phase and amplitude of $RF_2$ for a given amplifier output power and frequency. The phase and amplitude of $RF_2$ are adjustable for a given amplifier output power and frequency by adjusting one or more parameters of NLDF2. NLDF2 is implemented using look up tables, piecewise functions or polynomial functions, for example. $RF_2$ is then amplified by second power amplifier circuitry (second power amplifier) 105B and passed to combiner circuitry 106.

The combiner circuitry 106 combines $RF_1$ and $RF_2$ to generate an output RF signal $RF_{out}$. $RF_{out}$ may be received by a receiver (not shown). At the receiver, the output RF signal is down-converted, demodulated and converted from analogue to digital to obtain once again obtain a baseband signal (this may be referred to as I&$Q_{out}$).

For simplicity, the described embodiments may discuss RF signals being "output" by NLDF circuitry. However, in reality, the NLDF circuitry outputs an I&Q baseband signal (since an I&Q baseband signal is input) and this is subsequently converted to an RF signal using suitable additional circuitry (not shown) to convert the first signal from digital to analogue, modulate a carrier and up-convert to generate the RF signal. This is therefore what is what is meant when NLDF circuitry is said to "output" an RF signal. The details of conversion of a signal from I&Q baseband to RF is known in the art and is therefore not described in detail here.

In an example, each of the first and second amplifier circuitry 105A and 105B perform a respective one of the functions of a carrier amplifier and a peaking amplifier of an inverse Doherty amplifier and the combiner circuitry 106 performs the function of the combiner of an inverse Doherty amplifier. In particular, the first amplifier circuitry 105A may perform the function of the carrier amplifier and the second amplifier circuitry 105B may perform the function of the peaking amplifier. Alternatively, the first amplifier circuitry 105A may perform the function of the peaking amplifier and the second amplifier circuitry 105B may perform the function of the carrier amplifier. This is determined in advance and depends on the physical construction and characteristics of the amplifier.

In an example, the DPD circuitry (if present), first complex NLDF circuitry 102A and second complex NLDF circuitry 102B are comprised within a digital signal processor (DSP) 101.

Figure 2A:
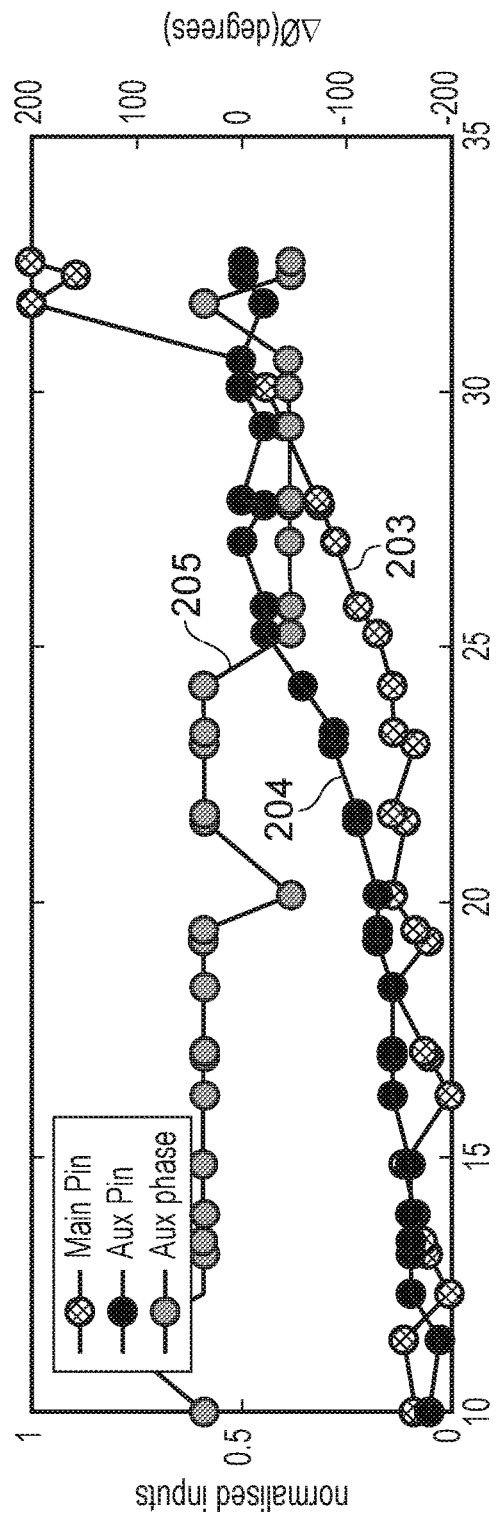
FIGS. 2A-C demonstrate different amplifier efficiencies at different amplitudes and phases.
Figure 2B:
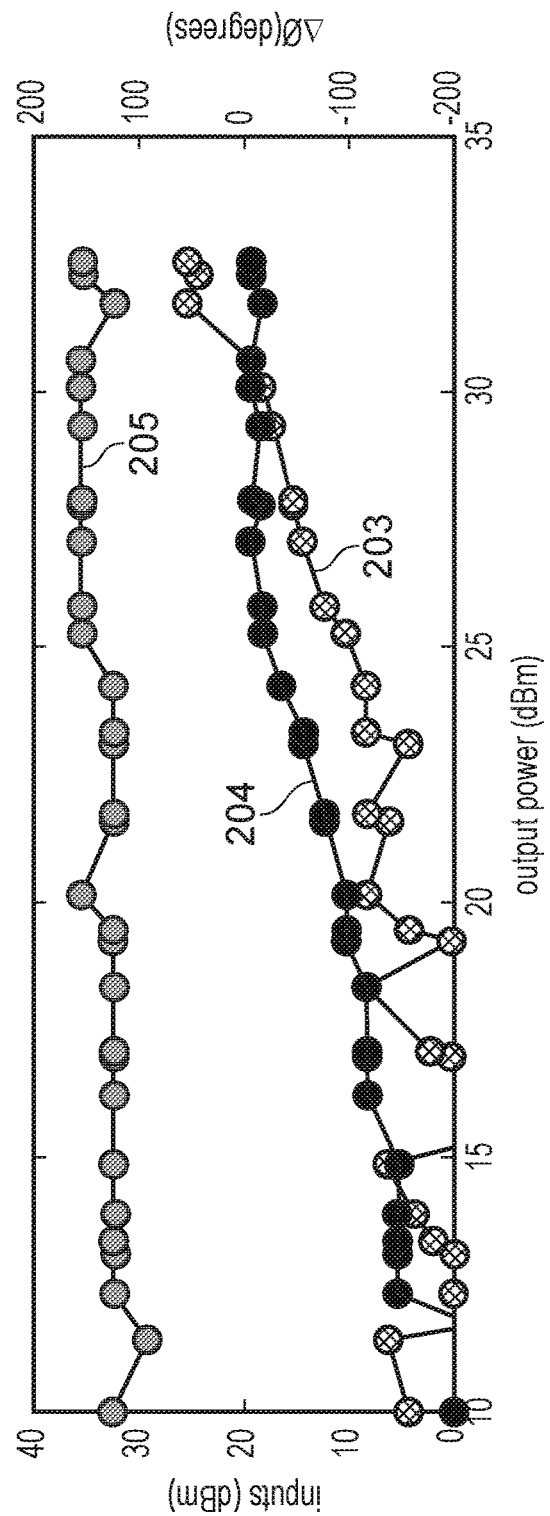
Figure 2C:
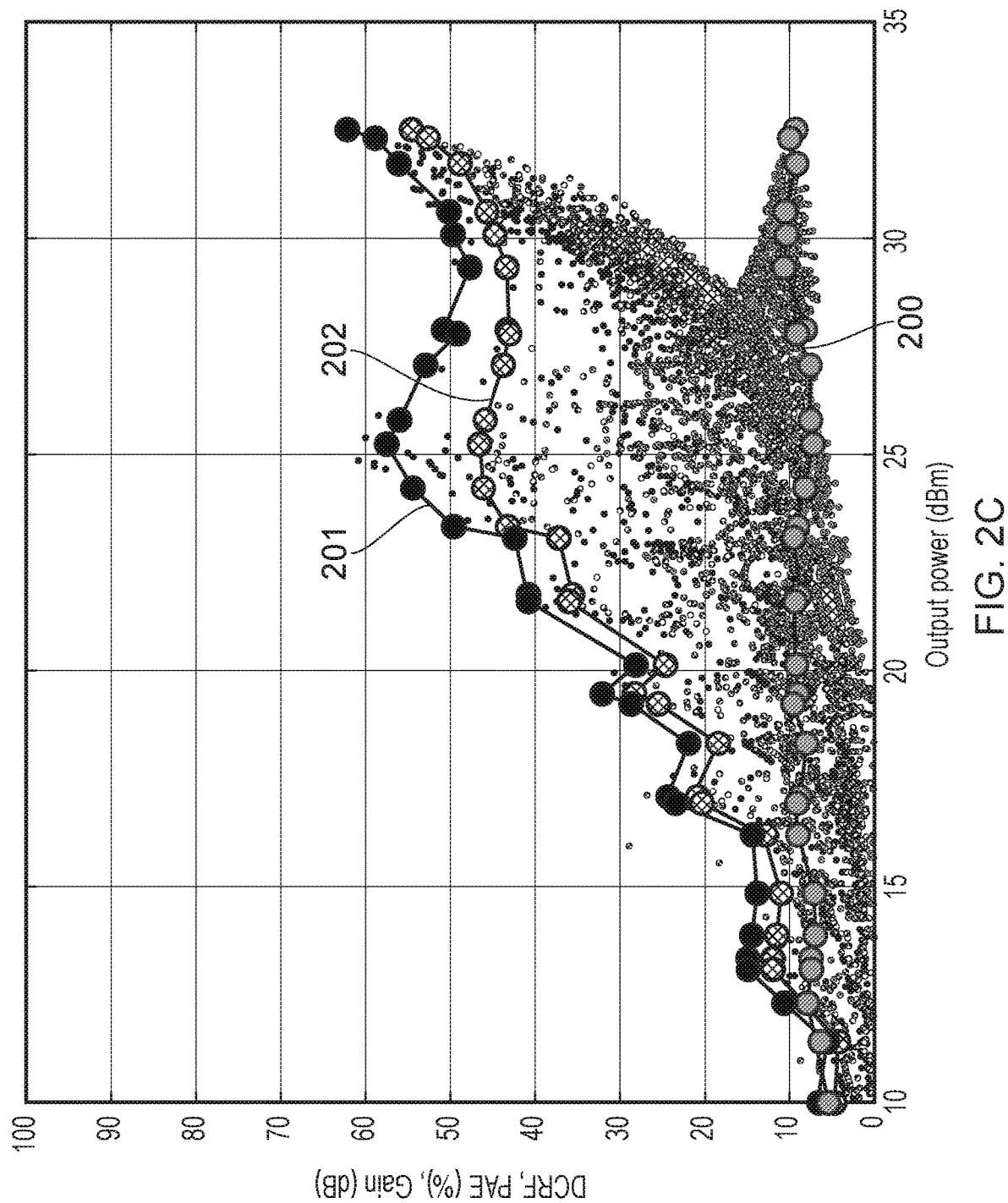

By suitably adjusting the amplitude and phase of each of $RF_1$ and $RF_2$, an improved power efficiency of the amplifier 100 at a given output power level can be found. This is illustrated in FIGS. 2A-C. In particular, FIG. 2C was generated by adjusting the $RF_1$ amplitude, $RF_2$ amplitude and phase of $RF_2$ relative to that of $RF_1$ (this is referred to as the relative phase of $RF_2$) for each output power level over a range of output power levels and measuring the efficiency of the amplifier for each output power level, $RF_1$ amplitude, $RF_2$ amplitude and $RF_2$ phase combination. The maximum efficiency achieved for each output power level is shown by lines 201 and 202. Line 201 shows the maximum DCRF efficiency (based on direct current (DC) input power and radio frequency (RF) output power) at each output power level. Line 202 shows the maximum power added efficiency (PAE) at each output power level. Line 200 of FIG. 2C shows the gain of amplifier 100 at each output power level when the $RF_1$ amplitude, $RF_2$ amplitude and $RF_2$ phase are adjusted to provide the maximum efficiency. FIGS. 2A and 2B show the $RF_1$ power 203, $RF_2$ power 204 and $RF_2$ phase 205 at each output power level which provide the maximum efficiency. FIG. 2A shows the $RF_1$ and $RF_2$ powers using a normalised scale and shows the $RF_2$ phase relative to that of $RF_1$. FIG. 2B shows the $RF_1$ and $RF_2$ powers in dBm and shows the raw measured $RF_2$ phase. It is noted FIGS. 2A-C were generated for an input signal $I\&Q_{in}$ with a fixed predetermined frequency.

Although improved efficiency of the amplifier 100 can be achieved by making suitable adjustments to the amplitude/power and phase of each of $RF_1$ and $RF_2$, providing the circuitry to allow this increases the complexity of the amplifier. There is therefore a need for an efficient amplifier with reduced complexity or, at least, a need for more easily implementing a trade off between improved efficiency and reduced complexity depending on the application of the amplifier.

FIG. 3 shows an amplifier 300 according to an embodiment. The amplifier 300 is the same as amplifier 100 except the second complex NLDF circuitry 102B is replaced with real NLDF circuitry 301 so that NLDF2 is a real (rather than complex) linear drive function. A real non-linear drive function is generally less complicated then a complex non-linear drive function. The use of a real NLDF2 therefore reduces the complexity of the amplifier 300. The real NLDF2 allows either the phase or amplitude (but not both) of $RF_2$ to be adjusted by adjusting one or more parameters of the real NLDF2. The efficiency of the amplifier 300 can therefore be improved within the constraint of a fixed $RF_2$ phase or amplitude by adjusting the other of the phase or amplitude which is not fixed (together with adjusting the phase and amplitude of $RF_1$). Like the complex NLDF2, the real NLDF2 is implemented using look up tables, piecewise functions or polynomial functions (but with only real rather than complex coefficients), for example. The amplifier 300 therefore allows an improved balance between amplifier efficiency and complexity.

FIG. 4 shows an amplifier 400 according to another embodiment. The amplifier 400 is the same as amplifier 100 except the only NLDF circuitry is complex NLDF circuitry 102A which performs NLDF1 and the input signal $I\&Q_{in}$ is not split prior to being passed to DPD circuitry 103 (if present) and complex NLDF circuitry 102A. Rather, $RF_1$ output by NLDF circuitry 102A is split by signal splitter circuitry (not shown) to generate first and second RF signals which are passed along first and second signal paths 104A and 104B, respectively. The first RF signal is amplified by the first power amplifier circuitry 105A and passed to combiner circuitry 106 in the same way as $RF_1$ in amplifiers 100 and 300. However, the second RF signal is subject to processing by signal processing circuitry 401 prior to being amplified by the second power amplifier circuitry 105B and passed to combiner circuitry 106. The signal processing circuitry 401 makes at least one of the amplitude of the second RF signal and phase of the second RF signal relative to the first RF signal (this is referred to as the relative phase of the second RF signal) constant for an input signal $I\&Q_{in}$ of a particular frequency. Examples of the signal processing circuitry 401 are described later.

The arrangement of FIG. 4 allows the two signals passed along the separate signal paths 104A and 104B of the amplifier 400 to be generated from the single signal $RF_1$ output by the complex NLDF circuitry 102A. The second NLDF circuitry 102B or 301 may therefore be completely absent from the amplifier 400, thus reducing the complexity of the amplifier 400. The phase and amplitude of the first RF signal split from $RF_1$ and passed along the first signal path 104A are adjustable by adjusting one or more parameters of NLDF1, as previously described. However, at least one of the amplitude and relative phase of the second RF signal split from $RF_1$ is fixed by signal processing circuitry 401. The efficiency of the amplifier 400 can therefore be improved within the constraint of the fixed amplitude and/or relative phase of the second RF signal (together with adjusting the phase and amplitude of the first RF signal). The amplifier 400 therefore allows an improved balance between amplifier efficiency and complexity.

Amplifier 400 may be particularly applicable to applications such as wireless telecommunications base stations in which the input to the amplifier 400 is a single baseband signal which cannot be adjusted by the supplier of amplifier 400. In this case, the amplifier 400 does not comprise the DSP 101 and the DSP 101 is instead provided upstream of the amplifier 400 by the base station supplier. The amplifier 400 can be easily installed in existing base stations since it can be connected to the single baseband signal output by the DSP 101 (which acts as $RF_1$ in FIG. 4).

FIGS. 5A-D show the efficiency of an amplifier for an input signal $I\&Q_{in}$ with a predetermined frequency and for a signal travelling along the first signal path 104A (e.g. $RF_1$ in FIG. 3 or the first split RF signal in FIG. 4) with a fixed amplitude and phase for different amplitudes and/or relative phases of a signal travelling along the second signal path 104B (e.g. $RF_2$ in FIG. 3 or the second split RF signal in FIG. 4) at each output power level over a range of output power levels. Darker points 501 show the DCRF efficiency and lighter points 502 show the PAE.

Figure 5A:
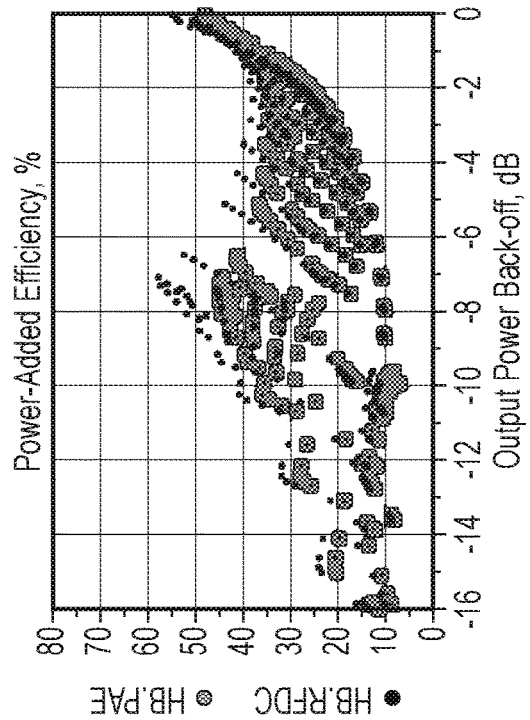
FIGS. 5A-D show the efficiency of an amplifier for different amplitudes and/or relative phases of a signal travelling along a second signal path 104B.
Figure 5B:
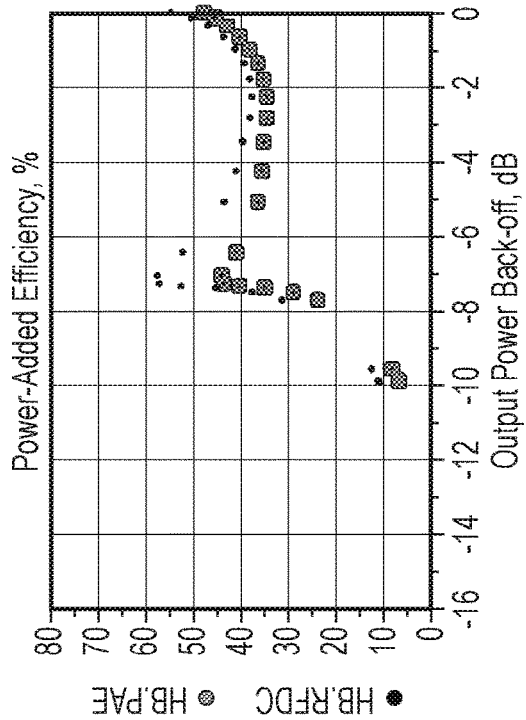
Figure 5C:
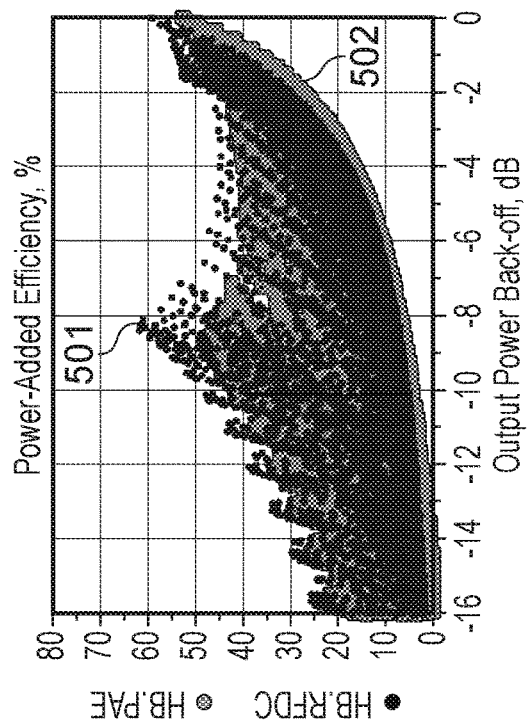
Figure 5D:
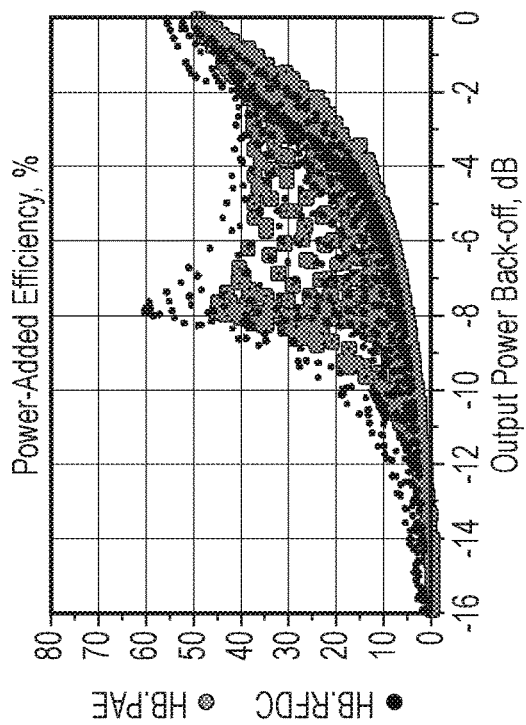

FIG. 5A was generated by adjusting the amplitude and relative phase of the signal travelling along the second signal path 104B and measuring the efficiency of the amplifier for each output power level, amplitude and phase combination. FIG. 5B was generated by adjusting only the relative phase of the signal travelling along the second signal path 104B (keeping the amplitude constant) and measuring the efficiency of the amplifier for each output power level and phase combination. FIG. 5C was generated by adjusting only the amplitude of the signal travelling along the second signal path 104B (keeping the relative phase constant) and measuring the efficiency of the amplifier for each output power level and amplitude combination. FIG. 5D was generated for a constant amplitude and relative phase. The efficiency of the amplifier is therefore fixed for each power level.

FIGS. 5A-D therefore demonstrate the trade off between greater control over amplifier efficiency (and therefore potentially greater improvement of amplifier efficiency) and greater complexity and lesser control over amplifier efficiency (and therefore potentially less improvement of amplifier efficiency) and less complexity. In particular, FIG. 5A represents the greatest efficiency control but also the greatest complexity (since both the amplitude and relative phase of the signal travelling along the second signal path 104B need to be adjustable). FIG. 5D represents the least efficiency control but also the least complexity (since both the amplitude and relative phase of the signal travelling along the second signal path 104B are fixed). FIGS. 5B and 5C represent a level of efficiency control between that of FIGS. 5A and 5D and a level of complexity between that of FIGS. 5A and 5D (since only one of the amplitude and relative phase of the signal travelling along the second signal path 104B needs to be adjustable). An efficiency profile like that of FIG. 5A is achievable by known amplifier 100. An efficiency profile like that of FIG. 5B or 5C is achievable by amplifier 300. An efficiency profile like that of FIG. 5D is achievable by amplifier 400. The present technique therefore provides amplifiers in which greater efficiency control (e.g. amplifier 300) or greater complexity reduction (e.g. amplifier 400) can be chosen depending on what the amplifier is used for.

Figure 6:
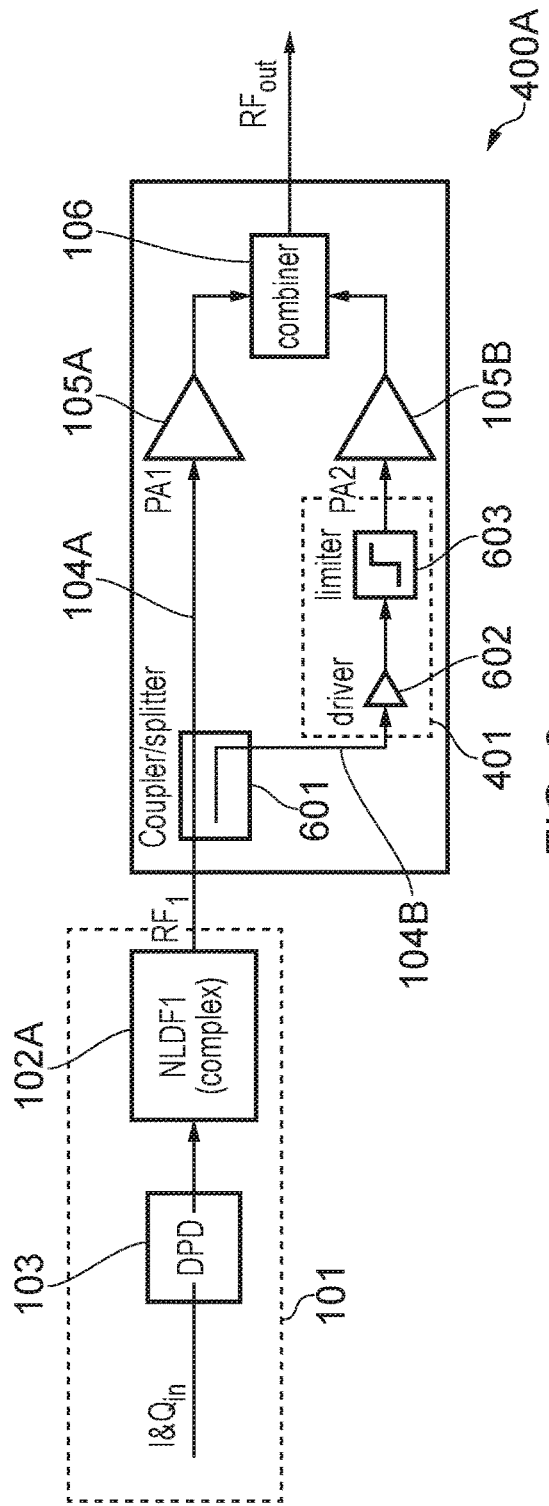
FIG. 6 schematically shows a first variant of the second embodiment.

FIG. 6 shows a first variant 400A of amplifier 400. The first and second RF signals are generated by splitter circuitry 601 and the signal processing circuitry 401 on the second signal path 104B comprises driver amplifier circuitry (driver) 602 followed by voltage limiter circuitry (limiter) 603. The second RF signal is first amplified by the driver 602. Its amplitude is then limited by limiter 603. The amount of amplification by the driver and the amplitude limit of the limiter are determined so that the processed second RF signal output by the limiter has a constant amplitude. In an example, the amount of amplification and the amplitude limit are determined so that the average peak amplitude of the second RF signal is within the amplitude limit and so that the second amplifier 105B is kept in saturation (the saturated output power of the second amplifier 105B may be only around 10% of the saturated output power of the first amplifier 105A, for example). The relative phase of the second RF signal is fixed by the length of the second signal path 104B (so a fixed phase delay is provided). The second RF signal of amplifier 400A therefore has a fixed amplitude and fixed relative phase. In an example, amplifier 400A is appropriate for use with an input signal I&Q$_{in}$ with a fixed predetermined frequency for which the fixed amplitude and fixed relative phase of the second RF signal can be determined in advance to increase the amplifier efficiency.

Figure 7:
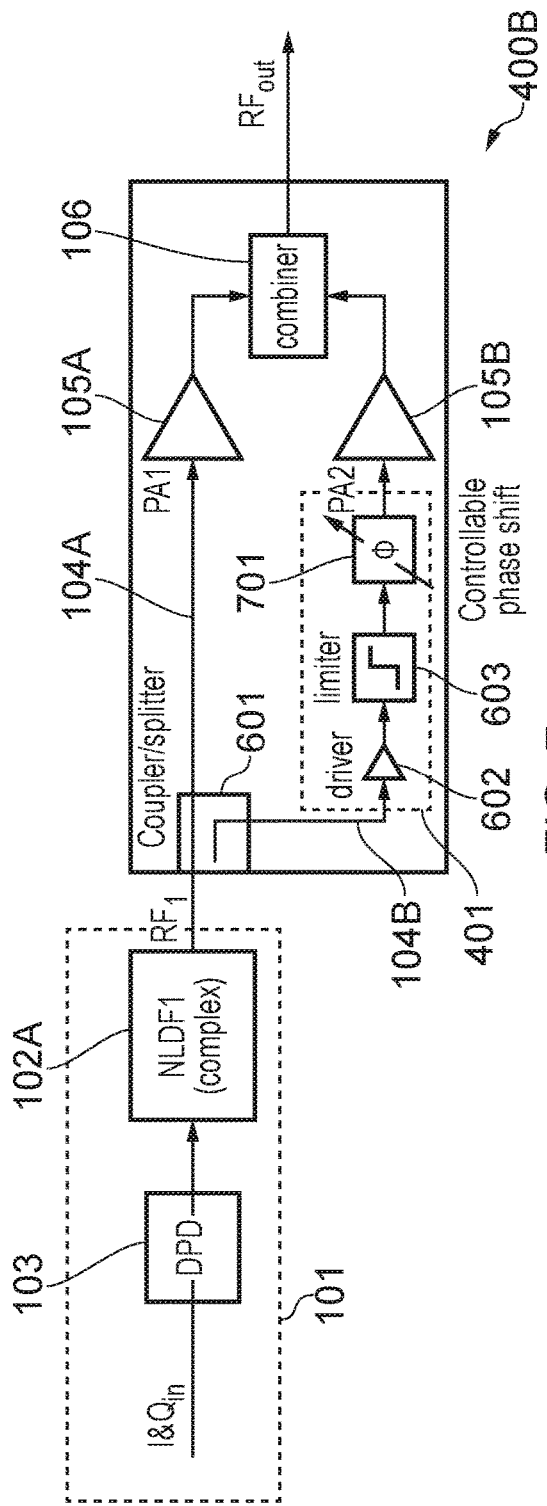
FIG. 7 schematically shows a second variant of the second embodiment.

FIG. 7 shows a second variant 400B of amplifier 400. The amplifier 400B is the same as amplifier 400A except that the signal processing circuitry 401 additionally comprises controllable phase shift circuitry (phase shifter) 701 for controlling the relative phase of the second RF signal. The phase shifter 701 is placed after the limiter 603 on the second signal path 104B in FIG. 7, but may be placed elsewhere on the second signal path 104B (e.g. before driver 602). The phase shifter 701 comprises, for example, suitable circuitry which allows the length of the second signal path 104B to be varied (to provide a variable phase delay) so as to control the relative phase of the second RF signal. Thus, although the amplitude of the second RF signal of amplifier 400B remains fixed, the relative phase of the second RF signal is controllable.

In an example, amplifier 400B is appropriate for use with an input signal I&Q$_{in}$ with a variable RF transmission frequency for which the fixed amplitude of the second RF signal is determined in advance but for which the relative phase of the second RF signal can be varied according to the variation of the RF frequency to increase the amplifier efficiency (this is because the optimally efficient relative phase of the second RF signal varies according to the input signal frequency). The frequency may be continuously or discretely variable and, correspondingly, the relative phase of the second RF signal may be continuously or discretely variable. The relationship between the input signal frequency and relative phase of the second RF signal is indicated by a lookup table, mathematical function or the like determined in advance (e.g. experimentally or by computer modelling) and stored in a storage medium (not shown), for example. The phase shifter 701 is controlled to adjust the relative phase of the second RF signal according to the input signal frequency and the relationship by suitable processing circuitry (not shown), for example. The storage medium and processing circuitry are comprised within the apparatus (e.g. base station) comprising the amplifier 400B, for example.

In an example, the baseband frequency of the input signal I&Q$_{in}$ is selectable from a plurality of discrete predetermined values. The relative phase of the second RF signal is then adjusted depending on the selected baseband frequency to increase the amplifier efficiency for that selected baseband frequency. This allows improved amplifier efficiency compared to having a fixed relative phase of the RF signal for all baseband frequencies.

In an example (which may be combined with the example of the previous paragraph), the input signal I&Q$_{in}$ is a frequency modulated signal and the relative phase of the second RF signal is continuously adjusted in real time depending on the modulation of the input signal frequency. This allows improved amplifier efficiency compared to having a fixed relative phase of the second RF signal for a frequency modulated signal.

Figure 8:
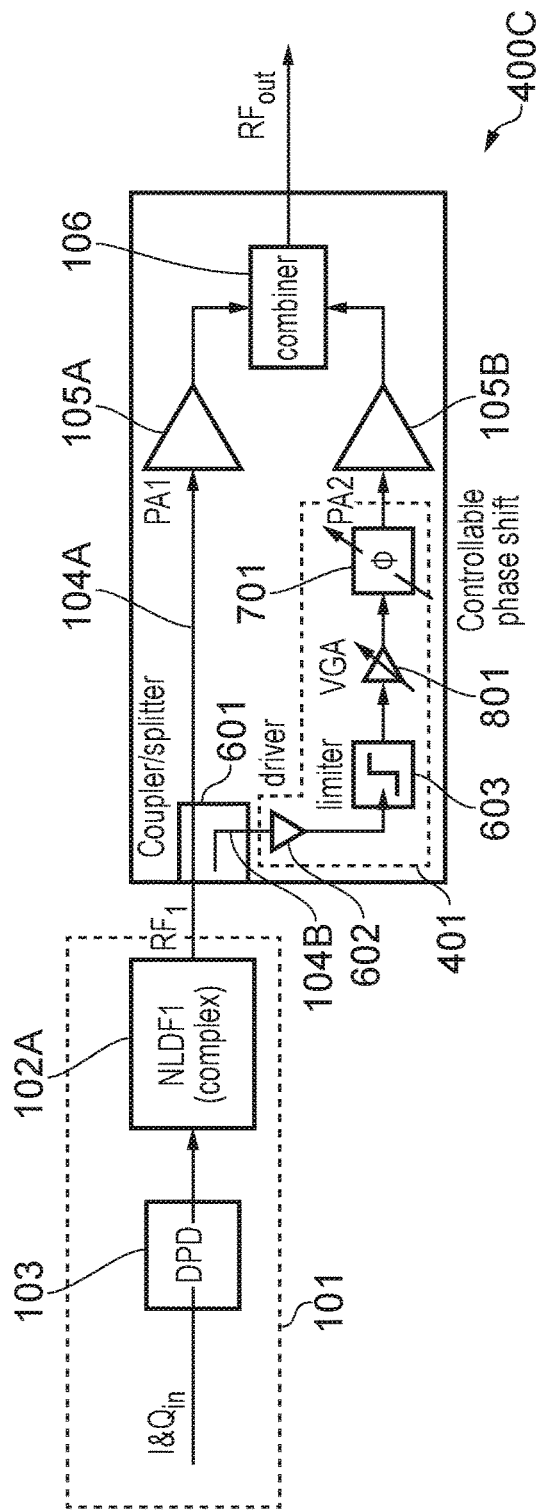
FIG. 8 schematically shows a third variant of the second embodiment.

FIG. 8 shows a third variant 400C of amplifier 400. The amplifier 400C is the same as amplifier 400B except that the signal processing circuitry 401 additionally comprises controllable amplitude adjustment circuitry (amplitude adjuster) 801 for controlling the amplitude of the second RF signal. The amplitude adjuster 801 is a variable gain amplifier (VGA) in FIG. 8 but the disclosure is not limited to this. For example, the amplitude adjuster 801 may be an attenuator. The amplitude adjuster 801 is placed after the limiter 603 but before the phase shifter 701 on the second signal path 104B in FIG. 8, but may be placed elsewhere on the second signal path 104B (e.g. after phase shifter 701). Thus, as well as the relative phase of the second RF signal being controllable, the amplitude of the second RF signal is also controllable in amplifier 400C. In an alternative embodiment, the phase shifter 701 may be omitted from amplifier 400C. In this case, although the relative phase of the second RF signal is determined in advance and remains fixed, the amplitude of the second RF signal is controllable.

In an example, amplifier 400C is appropriate for use with an input signal I&Q$_{in}$ with a variable RF transmission frequency for which the amplitude of the second RF signal can be varied according to the variation of the RF frequency to increase the amplifier efficiency (this is because the optimally efficient amplitude of the second RF signal varies according to the input signal frequency). The frequency may be continuously or discretely variable and, correspondingly, the amplitude of the second RF signal may be continuously or discretely variable. The relationship between the input signal frequency and amplitude of the second RF signal is indicated by a lookup table, mathematical function or the like determined in advance (e.g. experimentally or by computer modelling) and stored in a storage medium (not shown), for example. The amplitude adjuster 801 is controlled to adjust the amplitude of the second RF signal according to the input signal frequency and the relationship by suitable processing circuitry (not shown), for example. The storage medium and processing circuitry are comprised within the apparatus (e.g. base station) comprising the amplifier 400C, for example.

In an example, the baseband frequency of the input signal I&$Q_{in}$ is selectable from a plurality of discrete predetermined values. The amplitude of the second RF signal is then adjusted depending on the selected baseband frequency to increase the amplifier efficiency for that selected baseband frequency. This allows improved amplifier efficiency compared to having a fixed amplitude of the RF signal for all baseband frequencies.

In an example (which may be combined with the example of the previous paragraph), the input signal I&$Q_{in}$ is a frequency modulated signal and the amplitude of the second RF signal is continuously adjusted in real time depending on the modulation of the input signal frequency. This allows improved amplifier efficiency compared to having a fixed amplitude of the second RF signal for a frequency modulated signal.

Figure 9:
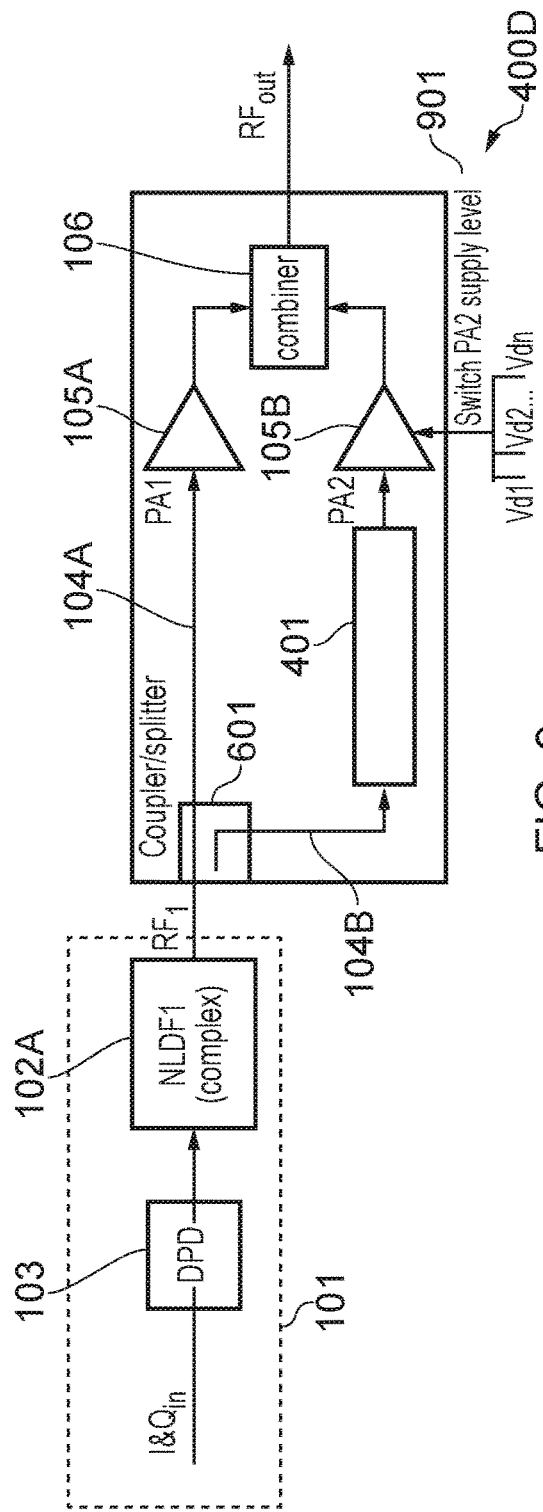
FIG. 9 schematically shows a fourth variant of the second embodiment.

FIG. 9 shows a fourth variant 400D of amplifier 400. The amplifier 400D has the signal processing circuitry 401 of amplifier 400A, 400B or 400C (or any other variant) but additionally comprises a controllable DC voltage supply 901 for controlling the DC voltage supplied to the second power amplifier 105B.

In an example, amplifier 400D is appropriate for use with an input signal I&$Q_{in}$ with a variable RF transmission frequency for which the DC voltage supplied to the second power amplifier 105B can be varied according to the variation of the RF frequency to increase the amplifier efficiency (this is because the optimally efficient DC voltage varies according to the input signal frequency). The frequency may be continuously or discretely variable (it is discretely variable between Vd1 to Vdn in the example of FIG. 9) and, correspondingly, the DC voltage may be continuously or discretely variable. The relationship between the input signal frequency and DC voltage is indicated by a lookup table, mathematical function or the like determined in advance (e.g. experimentally or by computer modelling) and stored in a storage medium (not shown), for example. The controllable DC voltage supply 901 is controlled to adjust the DC voltage according to the input signal frequency and the relationship by suitable processing circuitry (not shown), for example. The storage medium and processing circuitry are comprised within the apparatus (e.g. base station) comprising the amplifier 400D, for example.

In an example, the baseband frequency of the input signal I&$Q_{in}$ is selectable from a plurality of discrete predetermined values. The DC voltage is then adjusted depending on the selected baseband frequency to increase the amplifier efficiency for that selected baseband frequency. This allows improved amplifier efficiency compared to having a fixed DC voltage for all baseband frequencies.

In an example (which may be combined with the example of the previous paragraph), the input signal I&$Q_{in}$ is a frequency modulated signal and the DC voltage is continuously adjusted in real time depending on the modulation of the input signal frequency. This allows improved amplifier efficiency compared to having a fixed DC voltage for a frequency modulated signal.

The trade off between efficiency and complexity can therefore be easily and flexibly configured with the amplifier of the present disclosure depending on the requirements of each particular use case. For example, if lowest complexity is most important, variant 400A may be most appropriate. On the other hand, if highest efficiency is most important, variant 400D with the signal processing circuitry 401 of variant 400C and adjustment of second RF signal amplitude and relative phase in accordance with modulation of the input signal I&$Q_{in}$ may be most appropriate. For balanced efficiency and complexity, variants 400B or 400C (with or without adjustment of the second RF signal amplitude and/or relative phase in accordance with input signal frequency modulation) may be most appropriate. In all cases, however, complexity is reduced compared to the known amplifier 100 since second complex NLDF circuitry 102B is no longer required.

Figure 10:
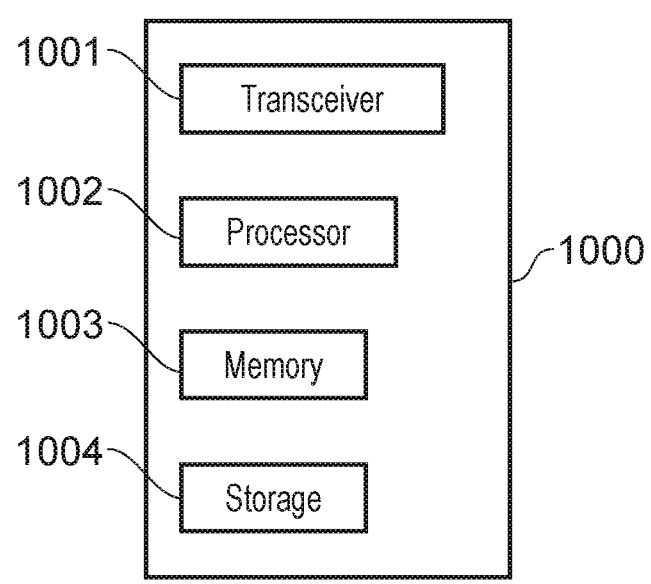
FIG. 10 schematically shows an example apparatus 1000 in which an amplifier of the present disclosure may be comprised.

FIG. 10 shows an apparatus 1000 in which an amplifier of the present disclosure may be comprised. The apparatus 1000 may be a wireless telecommunications base station (such as a macrocell, microcell, small cell, femtocell or picocell) or terminal device, for example. The apparatus comprises a transceiver 1001 for sending and/or receiving RF signals, a processor 1002 for processing electronic instructions, a memory 1003 for storing the electronic instructions to be processed and input and output data associated with the electronic instructions and a storage medium 1004 (e.g. in the form of a hard disk drive, solid state drive, tape drive or the like) for long term storage of digital information. Each of the transceiver 1001, processor 1002, memory 1003 and storage medium 1004 are implemented using appropriate circuitry, for example. The processor 1002 controls the operation of each of the transceiver 1001, memory 1003 and storage medium 1004. The amplifier of the present disclosure is comprised within the transceiver 1001 and, when adjustable, the amplitude, relative phase and/or DC voltage of the second signal path 104B is adjusted by the processor 1002 for different frequencies of the input signal I&$Q_{in}$ according to relationship information (e.g. a lookup table, mathematic function or the like) stored in the storage medium 1004 (as previously described).

Figure 11:
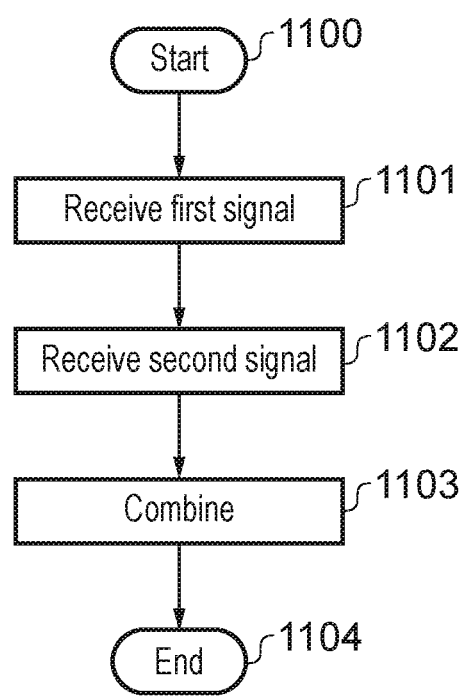
FIG. 11 shows a method according to an embodiment.

FIG. 11 shows a method according to an embodiment. The method is carried out by an amplifier of the present disclosure. The method starts at step 1100. At step 1101, a first signal (e.g. $RF_1$ in FIG. 3 or the first RF signal split from $RF_1$ in FIG. 4) is received by first amplifier circuitry 105A of a first signal path 104A. The first signal has a frequency and a variable phase and amplitude at the frequency. That is, the phase and amplitude can be adjusted, e.g. by complex NLDF circuitry 102A, even if the frequency is not changed. At step 1102 (which may occur concurrently with step 1101), a second signal (e.g. $RF_2$ in FIG. 3 or the second RF signal split from $RF_1$ in FIG. 4) is received by second amplifier circuitry 105B of a second signal path 104B. The second signal has the same frequency as the first signal. However, at least one of the relative phase and amplitude of the second signal is fixed at the frequency. That is, the fixed relative phase and/or amplitude cannot be adjusted when the frequency is not changed. This is achieved e.g. using real NLDF circuitry 301 (in which either the relative phase or amplitude remains the same for all frequencies) or signal processing circuitry 401 in which the relative phase and/or amplitude (if adjustable) are only adjustable when the frequency is changed (e.g. by the baseband frequency changing or due to frequency modulation of the input signal I&$Q_{in}$).

In an embodiment, the first and second signals are generated by splitting a signal derived from a single input signal I&$Q_{in}$. At step 1103, the output of the first amplifier circuitry and the second amplifier circuitry is combined to produce an output signal $RF_{out}$. The method ends at step 1104.

Some embodiments of the present technique are defined by the following numbered clauses:

1. An amplifier comprising:
   a first signal path comprising first amplifier circuitry configured to receive a first signal with a frequency and a variable phase and amplitude at the frequency;
   a second signal path comprising second amplifier circuitry configured to receive a second signal with the frequency, wherein at least one of the relative phase and amplitude of the second signal is fixed at the frequency;
   combiner circuitry configured to combine an output of the first amplifier circuitry and the second amplifier circuitry.
2. An amplifier according to clause 1, wherein the first and second signals are obtained by splitting a single input signal.
3. An amplifier according to clause 2, wherein the phase and amplitude of the first input signal at the frequency is variable using a complex non-linear drive function.
4. An amplifier according to clause 3, wherein:
   the phase and amplitude of the first input signal is variable at the frequency after splitting the single input signal; and
   only one of the relative phase and amplitude of the second input signal is variable at the frequency after splitting the input signal using a real non-linear drive function.
5. An amplifier according to clause 3, wherein:
   the phase and amplitude of the first input signal is variable at the frequency before splitting the single input signal;
   the second signal path has a phase delay to fix the relative phase of the second signal at the frequency; and
   the second signal path comprises third amplifier circuitry followed by an amplitude limiter to fix the amplitude of the second signal at the frequency.
6. An amplifier according to clause 5, wherein the second signal path comprises phase shift circuitry configured to vary the relative phase of the second signal according to variation of the frequency.
7. An amplifier according to clause 6, wherein the frequency is continuously variable and the relative phase of the second signal is correspondingly continuously variable.
8. An amplifier according to clause 6, wherein the frequency is one of a plurality of discrete predetermined frequencies and the relative phase of the second signal is correspondingly discretely variable.
9. An amplifier according to clause 5 or 6, wherein the second signal path comprises an amplitude adjuster configured to vary the amplitude of the second signal according to variation of the frequency.
10. An amplifier according to clause 9, wherein the frequency is continuously variable and the amplitude of the second signal is correspondingly continuously variable.
11. An amplifier according to clause 9, wherein the frequency is one of a plurality of discrete predetermined frequencies and the amplitude of the second signal is correspondingly discretely variable.
12. An amplifier according to any one of clauses 5, 6 or 9, wherein a power level supplied to the second amplifier circuitry is variable according to variation of the frequency.
13. An amplifier according to clause 12, wherein the frequency is continuously variable and the power level supplied to the second amplifier circuitry is correspondingly continuously variable.
14. An amplifier according to clause 12, wherein the frequency is one of a plurality of discrete predetermined frequencies and the power level supplied to the second amplifier circuitry is correspondingly discretely variable.
15. An amplifier according to any preceding clause, wherein each of the first and second signal paths is a respective one of a carrier amplifier signal path and a peaking amplifier signal path of an inverse Doherty amplifier.
16. A wireless telecommunications base station or terminal device comprising an amplifier according to any preceding clause.
17. An amplification method comprising:
   receiving, by first amplifier circuitry of a first signal path, a first signal with a frequency and a variable phase and amplitude at the frequency;
   receiving, by second amplifier circuitry of a second signal path, a second signal with the frequency, wherein at least one of the relative phase and amplitude of the second signal is fixed at the frequency; and
   combining an output of the first amplifier circuitry and the second amplifier circuitry.
18. A program for controlling a computer to perform a method according to clause 17.
19. A non-transitory storage medium comprising a program according to clause 18.

Numerous modifications and variations of the present disclosure are possible in light of the above teachings. It is therefore to be understood that within the scope of the appended claims, the disclosure may be practiced otherwise than as specifically described herein.

In so far as embodiments of the disclosure have been described as being implemented, at least in part, by software-controlled data processing apparatus, it will be appreciated that a non-transitory machine-readable medium carrying such software, such as an optical disk, a magnetic disk, semiconductor memory or the like, is also considered to represent an embodiment of the present disclosure.

It will be appreciated that the above description for clarity has described embodiments with reference to different functional units, circuitry and/or processors. However, it will be apparent that any suitable distribution of functionality between different functional units, circuitry and/or processors may be used without detracting from the embodiments.

Described embodiments may be implemented in any suitable form including hardware, software, firmware or any combination of these. Described embodiments may optionally be implemented at least partly as computer software running on one or more data processors and/or digital signal processors. The elements and components of any embodiment may be physically, functionally and logically implemented in any suitable way. Indeed the functionality may be implemented in a single unit, in a plurality of units or as part of other functional units. As such, the disclosed embodiments may be implemented in a single unit or may be physically and functionally distributed between different units, circuitry and/or processors.

Although the present disclosure has been described in connection with some embodiments, it is not intended to be limited to the specific form set forth herein. Additionally, although a feature may appear to be described in connection with particular embodiments, one skilled in the art would recognize that various features of the described embodiments may be combined in any manner suitable to implement the technique.

The invention claimed is:

1. An amplifier comprising:
a first signal path comprising first amplifier circuitry configured to receive a first signal with a frequency and a variable phase and amplitude at the frequency;
a second signal path comprising second amplifier circuitry configured to receive a second signal with the frequency, wherein at least one of a relative phase and amplitude of the second signal is fixed at the frequency;
combiner circuitry configured to combine an output of the first amplifier circuitry and the second amplifier circuitry;
wherein the first and second signals are obtained by splitting a single input signal;
the phase and amplitude of the first signal at the frequency is variable using a complex non-linear drive function;
the phase and amplitude of the first signal is variable at the frequency before splitting the single input signal;
the second signal path has a phase delay to fix the relative phase of the second signal at the frequency; and
the second signal path comprises third amplifier circuitry followed by an amplitude limiter to fix the amplitude of the second signal at the frequency.

2. The amplifier according to claim 1, wherein the second signal path comprises phase shift circuitry configured to vary the relative phase of the second signal according to variation of the frequency.

3. The amplifier according to claim 2, wherein the frequency is continuously variable and the relative phase of the second signal is correspondingly continuously variable.

4. The amplifier according to claim 2, wherein the frequency is one of a plurality of discrete predetermined frequencies and the relative phase of the second signal is correspondingly discretely variable.

5. The amplifier according to claim 1, wherein the second signal path comprises an amplitude adjuster configured to vary the amplitude of the second signal according to variation of the frequency.

6. The amplifier according to claim 5, wherein the frequency is continuously variable and the amplitude of the second signal is correspondingly continuously variable.

7. The amplifier according to claim 5, wherein the frequency is one of a plurality of discrete predetermined frequencies and the amplitude of the second signal is correspondingly discretely variable.

8. The amplifier according to claim 1, wherein a power level supplied to the second amplifier circuitry is variable according to variation of the frequency.

9. The amplifier according to claim 8, wherein the frequency is continuously variable and the power level supplied to the second amplifier circuitry is correspondingly continuously variable.

10. The amplifier according to claim 8, wherein the frequency is one of a plurality of discrete predetermined frequencies and the power level supplied to the second amplifier circuitry is correspondingly discretely variable.

11. The amplifier according to claim 1, wherein each of the first and second signal paths is a respective one of a carrier amplifier signal path and a peaking amplifier signal path of an inverse Doherty amplifier.

12. A wireless telecommunications base station or terminal device comprising an amplifier according to claim 1.

13. An amplifier comprising:
a first signal path comprising first amplifier circuitry configured to receive a first signal with a frequency and a variable phase and amplitude at the frequency;
a second signal path comprising second amplifier circuitry configured to receive a second signal with the frequency, wherein at least one of the relative phase and amplitude of the second signal is fixed at the frequency;
combiner circuitry configured to combine an output of the first amplifier circuitry and the second amplifier circuitry
wherein the first and second signals are obtained by splitting a single input signal;
the phase and amplitude of the first signal at the frequency is variable using a complex non-linear drive function
the phase and amplitude of the first signal is variable at the frequency after splitting the single input signal; and
only one of the relative phase and amplitude of the second signal is variable at the frequency after splitting the input signal using a real non-linear drive function.

14. An amplification method comprising:
splitting a single input signal into a first signal path and a second signal path;
receiving, by first amplifier circuitry of the first signal path, a first signal with a frequency and a variable phase and amplitude at the frequency;
using a complex non-linear drive function to vary the phase and amplitude of the first signal at the frequency:
wherein the phase and amplitude of the first signal is variable at the frequency before splitting the single input signal;
receiving, by second amplifier circuitry of the second signal path, a second signal with the frequency, wherein at least one of a relative phase and amplitude of the second signal is fixed at the frequency;
fixing the relative phase of the second signal at the frequency using a phase delay on the second signal path;
fixing the amplitude of the second signal, by third amplifier circuitry followed by an amplitude limiter in the second signal path, at the frequency and
combining an output of the first amplifier circuitry and the second amplifier circuitry.

15. A non-transitory computer readable storage medium having stored thereon code components that, when executed, cause a computer to perform the method according to claim 14.

* * * * *